United States Patent [19]
Ohnishi

[11] Patent Number: 5,512,837
[45] Date of Patent: Apr. 30, 1996

[54] VOLTAGE DROP DETECTING CIRCUIT

[75] Inventor: Shuji Ohnishi, Kyoto, Japan

[73] Assignee: Rohm Co., Ltd., Kyoto, Japan

[21] Appl. No.: 10,563

[22] Filed: Jan. 28, 1993

[30] Foreign Application Priority Data

Feb. 6, 1992 [JP] Japan .................................. 4-056217

[51] Int. Cl.⁶ ............................................ G01R 27/26
[52] U.S. Cl. ........................ 324/704; 340/661; 324/705
[58] Field of Search ............................ 324/704, 705;
340/870.38, 663, 661; 307/359, 362, 491,
272.3, 296.1, 296.4

[56] References Cited

U.S. PATENT DOCUMENTS

| | | | |
|---|---|---|---|
| 2,942,183 | 6/1960 | Chance | 324/705 |
| 3,813,665 | 5/1974 | Parfomak et al. | 340/661 |
| 4,101,839 | 7/1978 | Poole et al. | 307/359 |
| 4,409,500 | 10/1983 | Welland | 307/491 |
| 4,425,548 | 1/1984 | Kage | 307/359 |
| 4,495,472 | 1/1985 | Dwarakanath | 307/359 |
| 5,047,751 | 9/1991 | Miura et al. | 340/661 |
| 5,063,491 | 11/1991 | Shigeo | 340/663 |
| 5,172,018 | 12/1992 | Colandrea et al. | 307/359 |
| 5,233,329 | 8/1993 | Lippmann et al. | 340/661 |

Primary Examiner—Maura K. Regan
Attorney, Agent, or Firm—Brumbaugh, Graves, Donohue & Raymond

[57] ABSTRACT

In a voltage drop detecting circuit, when voltage Vcc being monitored is at a steady-state value, reference voltage B is classified by divided voltages Va to Vc from detection voltage generation circuit group for classification of reference voltage. In accordance with the result of that classification, one of the divided voltages Va to Vc from detection voltage generation circuit group for detection of a drop in the voltage being monitored is selected as detection voltage A. Since the resistance ratio can be expressed fairly correctly in ICs, the circuit structure of the voltage drop detecting circuit is capable of reducing the apparent range of variation of reference voltage B, whereby the precision of detection is improved.

3 Claims, 3 Drawing Sheets

5,512,837

VOLTAGE DROP DETECTING CIRCUIT

BACKGROUND OF THE INVENTION

The present invention relates to a voltage drop detecting circuit, more particularly, to a voltage drop detecting circuit by which a drop in a voltage being monitored such as a supply voltage can be detected with a more accurate threshold value and which has such a structure as to permit incorporation into ICs.

In circuits having a memory backed up with a battery, it is necessary that the source of power supply to the memory is changed to the backup battery when the supply of power to the whole circuit is interrupted. The timing of this change may be determined by a voltage drop detecting circuit which, while monitoring the supply voltage, generates a voltage drop detection signal when the supply voltage has dropped below the operating voltage of the memory.

FIG. 3 is a block diagram showing a prior art voltage detecting circuit, in which reference numeral 1 designates a comparison circuit, 2 is a reference voltage generation circuit, and 3 is a detection voltage generation circuit.

The comparison circuit 1 is chiefly composed of a comparator; it compares detection voltage A with reference voltage B and outputs a voltage drop detection signal C if the detection voltage A is smaller than the reference voltage B.

The reference voltage generation circuit 2 is typically composed of a diode or a transistor and is basically intended to generate reference voltage B of a given value that is independent of the variation in the supply voltage.

The detection voltage generation circuit 3 is composed of resistors connected in series between a terminal connected to the supply voltage Vcc and a terminal connected to the ground (GND) and it generates detection voltage A by voltage division of the supply voltage Vcc through resistor change. The ratio between the resistances provided by the resistors is specified in such a way that the detection voltage A coincides with the reference voltage B when the supply voltage Vcc is equal to the threshold level to be detected.

Given the circuit structure described above, voltage drop detection signal C will not be produced as output when the supply voltage Vcc is of a steady-state value since the detection voltage A is greater than the reference voltage B.

However, if the supply voltage Vcc has dropped below the threshold level, the detection voltage A becomes less than the reference voltage B, causing voltage drop detection signal C to be produced as output.

Hence, the necessary processing may be performed at a timing equal to that of outputting of voltage detection signal C. To take the above-described case as an example, one may insure that the source of power supply to the memory is changed to the backup battery at a timing equal to that of outputting of voltage detection signal C.

A problem with the prior art voltage detector circuit is that the reference voltage generation circuit which is typically composed of a diode or a transistor experiences variations in the reference voltage from one product IC to another on account of the effects of fabrication process and the materials used. One of the methods that have been proposed to eliminate these variations is to repeat measurements and adjustments by laser trimming or some other suitable technique until the necessary precision is attained for individual ICs.

However, this method requires expensive facilities and a lot of steps, so the scope of its application is limited to areas of high added value such as measuring instrumentation. Hence, the voltage drop detecting circuit in general-purpose ICs of low added value has suffered from the problem that the threshold value for detection varies greatly from one IC to another.

SUMMARY OF THE INVENTION

An object, therefore, of the present invention is to solve the aforementioned problems of the prior art by providing a voltage drop detecting circuit with which a drop in a voltage being monitored such as a supply voltage can be detected without experiencing any variation in the detection threshold from one IC to another and which has a circuit structure suitable for incorporation into ICs.

The voltage drop detecting circuit of the present invention which is capable of attaining the above-stated object comprises a first resistor connected to a line of the voltage to be monitored, a first resistor group circuit composed of a plurality of second resistors that are connected downstream of the first resistor and which increase or decrease progressively in resistance, a second resistor group circuit composed of a plurality of fourth resistors that are connected downstream of the first resistor (or a third resistor) and which increase or decrease progressively in resistance in the same order as the second resistances do in the first resistor group circuit, a selective connecting circuit by which at least one of the resistors in each of the first and second resistor group circuits is connected selectively to a line of reference voltage, and a voltage detection circuit that senses that the voltage at the junction between the first resistor (or the third resistor) and the second resistor group circuit has dropped below a predetermined level, in which the ratio of the resistance of each of the resistors in the first resistor group circuit to the first resistor and the ratio of the resistance of each of the resistors in the second resistor group circuit to the first resistor (or the third resistor) are such that the ratio between the two ratios is in substantial correspondence to the ratio between the voltage being monitored in a steady-state and the predetermined level, when the voltage being monitored is in a steady-state, the resistors in the first resistor group circuit are selected sequentially by the selective connecting circuit to be connected to the line of reference voltage and, when a voltage drop is detected by the voltage detection circuit, the resistors in the second resistor group circuit are selectively connected to the line of reference voltage in accordance with the order in which the resistors have been selected by the selective connecting circuit.

More specifically, the present invention provides a voltage drop detecting circuit that generates a detection voltage of a value that complies with the voltage being monitored, that compares the detection voltage with the reference voltage generated by a reference voltage generating circuit, and that generates a voltage drop detection signal upon sensing that the voltage being monitored has dropped below a predetermined threshold level, which detecting circuit comprises:

a first group of detection voltage generating circuits that comprises a first detection voltage generating circuit which, when a first switch circuit connected in series to a first resistor circuit having a first resistance ratio which is the same as the ratio between the steady-state value of the voltage being monitored and the design value of the reference voltage (or which is within the range of variation of the reference voltage from the design value) receives a first selection signal, generates a first divided voltage as the detection voltage by voltage division of said voltage being monitored through resistor change in accordance with the first resistance ratio, and a second detection voltage generating circuit which, when a second switch circuit connected in series to a second resistor circuit having a second resistance ratio which is greater or smaller than the first resistance ratio outside the range of variation receives a second selection signal, generates a second divided voltage as the detection voltage by voltage division of the voltage being monitored through resistor change in accordance with the second resistance ratio;

a second group of detection voltage generating circuits that comprises a third detection voltage generating circuit which, when a third switch circuit connected in series to a third resistor circuit having a third resistance ratio of a value equal to the ratio between the steady-state value of the voltage being monitored and the threshold level as multiplied by the first resistance ratio receives a third selection signal, generates a third divided voltage as the detection voltage by voltage division of the voltage being monitored through resistor change in accordance with the third resistance ratio, and a fourth detection voltage generating circuit which, when a fourth switch circuit connected in series to a fourth resistor circuit having a fourth resistance ratio of a value equal to the ratio between the steady-state value of the voltage being monitored and the threshold level as multiplied by the second resistance ratio receives a fourth selection signal, generates a fourth divided voltage as the detection voltage by voltage division of the voltage being monitored through resistor change in accordance with the fourth resistance ratio; and a selection signal generating circuit which, upon receiving an external trigger signal that provides the timing of starting the operation of the circuit, outputs a first selection signal temporarily and which, if the voltage drop detection signal is generated accordingly, outputs a third selection signal and, if not, outputs a second selection signal temporarily, and which outputs a fourth selection signal upon receiving the voltage drop detection signal that is generated accordingly.

With a voltage drop detecting circuit incorporated in an IC, the reference voltage generated with a diode, a transistor or the like is prone to vary greatly but the resistance ratio will hardly vary. Taking advantage of this fact, the voltage drop detecting circuit of the present invention has a plurality of detection voltage generation circuits that are capable of generating detection voltages with comparatively high precision by relying upon voltage division through resistor change. When a reference voltage generation circuit completed as part of a commercial IC is operated, it will generate a reference voltage deviated from the design value. In accordance with the present invention, there is used one of the detection voltage generation circuits that generates a detection voltage of a sufficient value to offset the deviation. As a result, the range of variation of the reference voltage can apparently be reduced to less than a half, accomplishing an improvement in the precision of detection.

The operation of the detecting circuit of the present invention is described below more specifically. If it receives a trigger signal when the voltage being monitored is at a steady-state value, it outputs a first selection signal and a first divided voltage is accordingly produced as a detection voltage. Since the voltage being monitored is at a steady-state value and because the resistance ratio of a first voltage division circuit is in the neighborhood of the ratio between the steady-state value and the design value of reference voltage, the detection voltage generated in the case under consideration is in the neighborhood of the design value of reference voltage. The reference voltage is to be compared with the resulting detection voltage and, in consideration of the fact just mentioned above, this means that the reference voltage is compared with a value in the neighborhood of the design value. Hence, one may safely conclude that if a voltage drop detection signal is generated in response to the first selection signal, the reference voltage is deviated to a value greater than a value in the neighborhood of the design value whereas if no voltage drop detection signal is generated in response to the first selection signal, the reference voltage is deviated to a value smaller than a value in the neighborhood of the design value. Thus, the deviation of reference value from the design value can be classified by selection on the first detection voltage generation circuit.

Furthermore, the relationship between the first resistance ratio and the third resistance ratio is determined by the ratio between the steady-state value of the voltage being monitored and the threshold value for detection. Therefore, if, in response to the generation of a voltage drop detection signal in association with the first selection signal, the outputting of a third selection signal is retained, the detection voltage for the case where the voltage being monitored is at the threshold design value will assume a value in the neighborhood of the reference voltage which is deviated to a value greater than a value in the neighborhood of the design value. Similarly, if, in response to the generation of a voltage drop detection signal in associated with the second selection signal, the outputting of a fourth selection signal is retained, both the reference voltage and the fourth divided voltage are small in the same proportion as determined by the relationship between the second resistance ratio and the fourth resistance ratio and, hence, the detection voltage for the case where the voltage being monitored is at the threshold design value will assume a value in the neighborhood of the reference voltage which is deviated to a value smaller than a value in the neighborhood of the design value.

Thus, if a third selection signal is produced as output in response to the generation of a voltage drop detection signal in association with the first selection signal, voltage drop detection signals will subsequently be produced as output when the voltage being monitored assumes a value in the neighborhood of the threshold design value. If no voltage drop detection signal is generated in response to the first selection signal, the second divided voltage is selectively produced as an output detection voltage in response to the outputting of the second selection signal. Since the output detection voltage is present at a small value outside the range of variation of reference voltage, a voltage drop detection signal is generated in response to the second selection signal, causing a fourth selection signal to be produced as output. Then, as in the case just described above, voltage drop detection signals will subsequently be produced as output when the voltage being monitored assumes a value in the neighborhood of the threshold design value.

Thus, the variation of reference voltage is classified by the first divided voltage and a detection voltage appropriate for the class to which a particular value of reference voltage belongs is selectively produced as a sufficient output to offset the deviation of that particular value of reference voltage from the design value.

As a result, the range of variation of reference voltage is apparently reduced, whereby the precision of detection is accordingly improved.

If the first detection voltage generating circuit is designed to make a pair with the third detection voltage generating circuit and if more than one pair of such circuits are provided, the range of variation of reference voltage can accordingly be classified more finely to accomplish even greater improvement in the precision of detection.

DETAILED DESCRIPTION OF THE INVENTION

Figure 1:
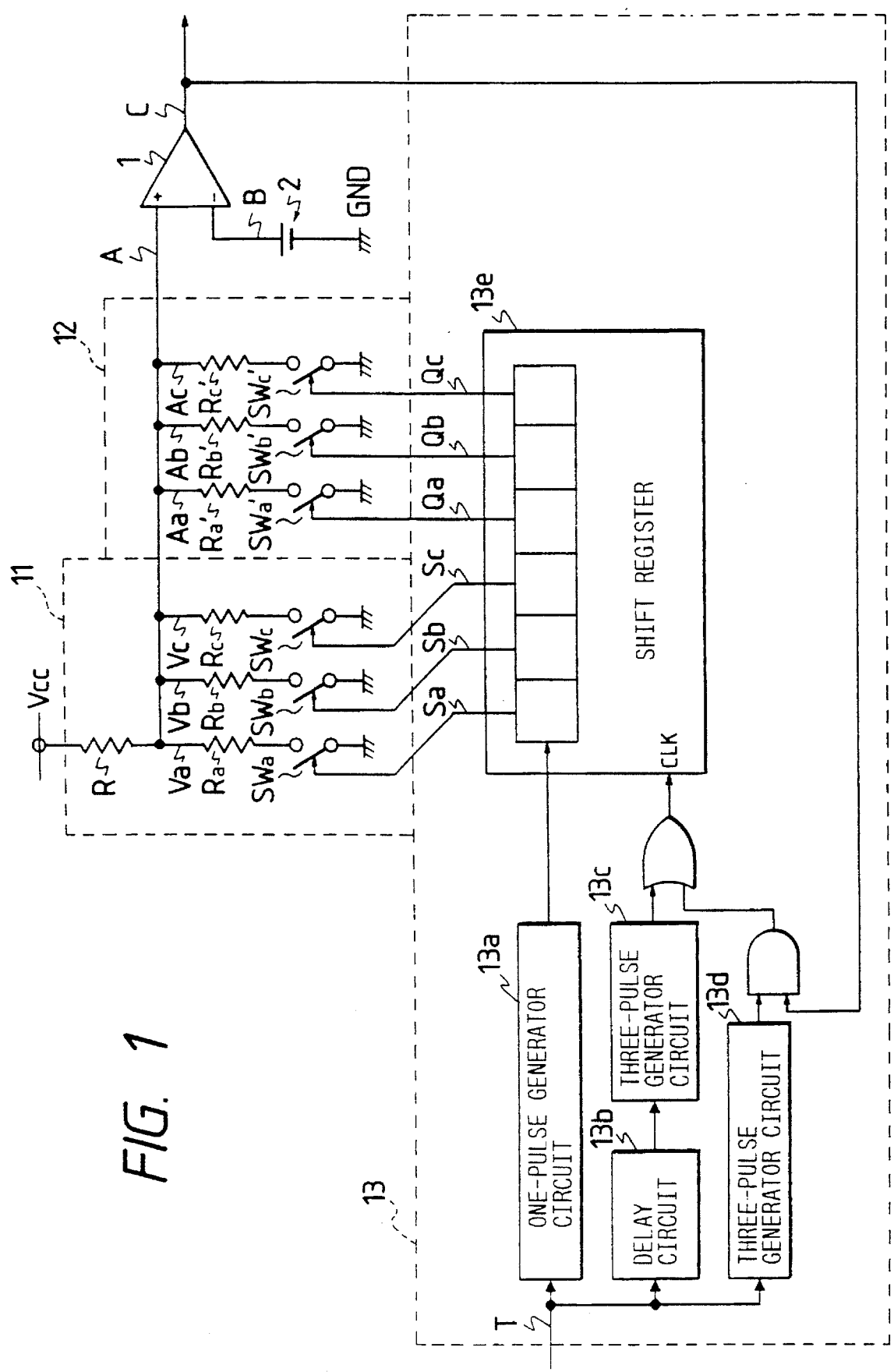
FIG. 1 is a block diagram showing an embodiment of the voltage drop detecting circuit composed in accordance with the present invention.

An embodiment of the voltage drop detecting circuit of the present invention will be described below with reference to the block diagram of FIG. 1, in which reference numeral 1 designates a comparison circuit, 2 is a reference voltage generating circuit, 11 is a group of detection voltage generating circuits for classifying the reference voltage, 12 is a group of detection voltage generating circuits for detecting a drop in the voltage being monitored, and 13 is a selection signal generating circuit.

Figure 3:
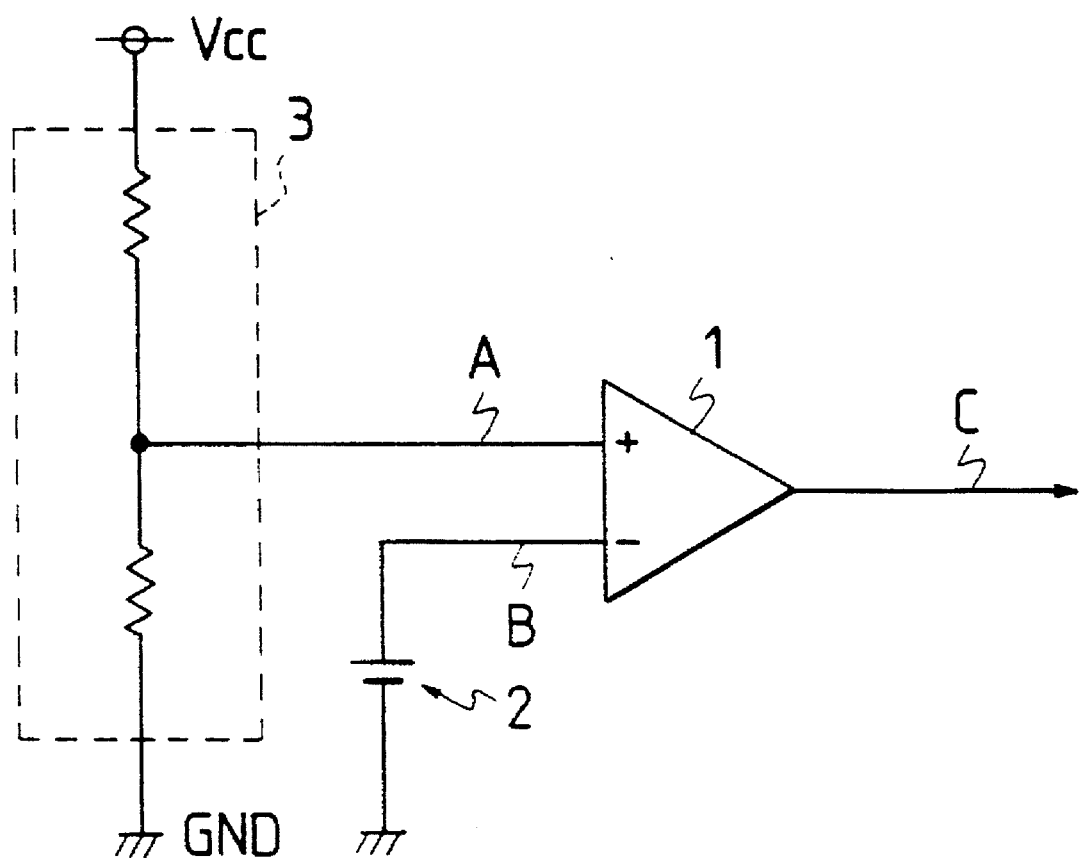
FIG. 3 is a block diagram showing a prior art voltage drop detecting circuit.

Since the comparison circuit 1 and the reference voltage generating circuit 2 have the same structure as shown in FIG. 3, they are identified by like numerals and will not be discussed again. The detection voltage generating circuit group 11 is a specific example of the circuit that consists of a first resistor and a first resistor group circuit, and the detection voltage generating circuit group 12 is a specific example of the first resistor (or a third resistor) and a second resistor group circuit.

The detection voltage generating circuit group 11 is composed of three detection voltage generating circuits that share a voltage dividing resistor R connected to a supply voltage Vcc which is the voltage to be monitored. Each detection voltage generating circuit is composed of a series connection of a resistor (Ra, Rb or Rc) to be connected to the ground (GND) and a switch (SWa, SWb or SWc). When a particular switch is selected in response to an applied selection signal, the supply voltage Vcc is divided by the combination of the voltage dividing resistor and the GND resistor to generate a detection voltage A. Stated more specifically, the circuit group 11 generates a first divided voltage Va as detection voltage A upon receiving a selection signal Sa; it generates a little higher second divided voltage Vb as detection voltage A upon receiving a selection signal Sb; and it generates an even little higher third divided voltage Vc as detection voltage A upon receiving a selection signal Sc. Thus, the three detection voltage generating circuits composing the circuit group 11 generate progressively increasing detection voltages, with the reference voltage B being intermediate between the highest and the lowest values. The third divided voltage Vc is set at the upper limit of the range of variation of the reference voltage B.

The detection voltage generating circuit group 12 is composed of three detection voltage generating circuits that share with the three detection voltage generating circuits of group 11 the voltage dividing resistor R connected to the supply voltage Vcc which is the voltage to be monitored. Each detection voltage generating circuit is composed of a series connection of a resistor (Ra', Rb' or Rc') to be connected to the ground (GND) and a switch (SWa', SWb' or SWc'). When a particular switch is selected in response to an applied selection signal, the supply voltage Vcc is divided by the combination of the voltage dividing resistor and the GND resistor to generate detection voltage A. Stated more specifically, the circuit group 12 generates a fourth divided voltage Aa as detection voltage A upon receiving a selection signal Qa; it generates a little higher fifth divided voltage Ab as detection voltage A upon receiving a selection signal Qb; and it generates an even little higher sixth divided voltage Ac as detection voltage A upon receiving a selection signal Qc. Thus, the three detection voltage generating circuits composing the circuit group 12 generate progressively increasing detection voltages in order to detect any drop in the supply voltage.

The selection signal generator circuit 13 is chiefly composed of a shift register 13e. Upon receiving an external trigger signal T that provides the timing for starting its operation, the circuit 13 outputs the first selection signal Sa temporarily and, if there is generated a corresponding voltage drop detection signal C, the circuit 13 will output the fourth selection signal Qa. If there is no generation of voltage drop detection signal C, the circuit 13 will output the second selection signal Sb temporarily and, if there is generated a corresponding voltage drop detection signal C, the circuit 13 will output the fifth selection signal Qb. Otherwise, the circuit 13 outputs the third selection signal Sc temporarily and, in response to the generation of a corresponding voltage drop detection signal C, it will output the sixth selection signal Qc. Since the third divided voltage Vc is set at the upper limit of variation of the reference voltage B, the outputting of the third selection signal Sc will invariably result in the generation of a corresponding voltage drop detection signal C.

The operation of the selection signal generating circuit 13 will be described below in detail. When a trigger signal T providing the timing for starting the operation of that circuit is supplied from an external circuit, a pulse from a one-pulse generator circuit 13a is supplied as a serial input to the shift register 13e whereas the first pulse from a three-pulse generator circuit 13d is supplied as a clock input to the shift register 13e, which then outputs selection signal Sa. Further, subsequent pulses from the three-pulse generator circuit 13d are supplied as clock inputs to the shift register 13e, whereupon selection signals Sb and Sc taking over the selection signal Sa will be produced consecutively. If, in this process, a voltage drop detection signal C is produced as output, the subsequent pulses from the three-pulse generator circuit 13d will be suppressed by the AND gate and, hence, the selection signal which is to select the detection voltage generator circuit that will generate a divided voltage slightly greater than the reference voltage B is retained as output.

Since the applied trigger signal T is delayed with a delay circuit 13b, there is a corresponding time lag in the supply of three pulses from the three-pulse generator circuit 13d as clock inputs to the shift register 13e. As a consequence, the output of the shift register 13e is shifted by three bits, causing a signal change to Qa if the selection signal being output is Sa, or to Qb if the selection signal being output is Sb, or to Qc if the selection signal being output is Sc.

More specific discussion of the present invention will be made below with actual numerical data being assigned to the individual kinds of voltage. Take, for example, the case where the voltage to be monitored, Vcc, has a steady-state value of 5.0 V, the threshold value for detection of a voltage drop is 3.0 V and the reference voltage B which has a design value of 1.0 V will vary in actually fabricated ICs over the range of from 0.8 V to 1.1 V. The degree by which the reference voltage B will vary from one IC to another should be evaluated from the actual process data.

With the prior art voltage drop detector circuit, the ratio of resistances to be provided by the detection voltage generating circuits is predetermined in such a way that a detection voltage A of 1.0 V will be produced when the voltage Vcc is 3.0 V; however, on account of variations in the reference voltage B, the voltage Vcc as occurring when a voltage drop detection signal C is delivered will vary from 2.4 V (=0.8*3.0/1.0) to 3.3 V (=1.1*3.0/1.0).

In the embodiment of the present invention under discussion, the ratio of resistances to be provided by the detection voltage generating circuits of group 12 are predetermined in such a way that divided voltages Aa, Ab and Ac will be 0.9 V, 1.0 V and 1.1 V, respectively, when the supply voltage Vcc is 3 V. Accordingly, the ratio of resistances to be provided by the detection voltage generating circuits of group 11 are predetermined in such a way that divided voltages Va, Vb and Vc will be 0.9 V, 1.0 V and 1.1 V, respectively, when the voltage Vcc is 5 V. These settings satisfy structural requirements of the present invention; furthermore, the ratio of resistances in each IC is of comparatively high precision and, hence, the value of detection voltage A to be generated by the above-mentioned voltage division through resistor change is accurate.

Given the conditions set forth above, let us assume that a trigger signal T is applied when the supply voltage Vcc is at the steady-state value 5 V. First, in the case where the reference voltage B is in the range of 0.8 to 0.9 V, a detection voltage A of 0.9 V is generated in response to selection signal Sa; subsequently, a voltage drop detection signal C is also produced and, eventually, selection signal Qa is retained as an output. Hence, in the first case under consideration, the voltage Vcc as occurring when the voltage drop detection signal C is delivered will vary from 2.67 V (=3.0*0.8/0.9) to 3.0 V (=3.0*0.9/0.9).

Then, in the case where the reference voltage B is in the range of 0.9 to 1.0 V, no voltage drop detection signal C will be produced even if a detection voltage A of 0.9 V is generated in response to selection signal Sa; then a detection voltage A of 1.0 V is generated in response to selection signal Sb and, subsequently, a voltage drop detection signal C is also produced and, eventually, selection signal Qb is retained as an output. Hence, in the second case under consideration, the voltage Vcc as occurring when the voltage drop detection signal C is delivered will vary from 2.7 V (=3.0*0.9/1.0) to 3.0 V (=3.0*1.0/1.0).

The third case to be discussed is where the reference voltage B is in the range of 1.0 to 1.1 V. Even if a detection voltage A of 0.9 V is generated in response to selection signal Sa, no voltage drop detection signal C will be produced; furthermore, even if a detection voltage A of 1.0 V is generated in response to selection signal Sb, a voltage drop detection signal C will not be produced, either; when a detection voltage of 1.1 V is generated in response to selection signal Sc, a voltage drop detection signal C is also produced subsequently and, eventually, selection signal Qc is retained as an output. Hence, in the third case under consideration, the voltage Vcc as occurring when the voltage drop detection signal C is delivered will vary from 2.73 V (=3.0*1.0/1.1) to 3.0 V (=3.0*1.1/1.1).

In the prior art, the actual threshold value varies over the range of 0.9 V (=3.3–2.4); however, in the embodiment under consideration, the range of variation is reduced to 0.33 V (=3.0–2.67) and the precision of detection is improved accordingly.

Selection signals Sa to Sc and Qa to Qc are such that two or more signals will not be produced simultaneously; hence, in the embodiment under consideration, the resistor connected to the supply voltage Vcc is shared by all the detection voltage generating circuits in order to reduce the overall circuit scale.

In the embodiment just described above, three sets of a detection voltage generator are provided, each consisting of a pair of the first and fourth detection voltage generating circuits. Although a minimum of two sets of such detection voltage generator will suffice, the use of more detection voltage generators will contribute to a higher precision of detection since the variation in reference voltage can be classified more finely. To this end, the number of bits in the shift register and that of pulses to be generated by the pulse generator circuit may be increased in proportion to the increase in the number in sets of detection voltage generators.

In the embodiment described above, detection voltages are compared in the increasing order but this is not the sole case of the present invention and detection voltages may be compared in the decreasing order. In this alternative case, the third divided voltage Vc is set at the lower limit of the range of variation of the reference voltage B and the inputs of the comparison circuit 1 or the positive/negative logic of voltage drop detection signals may be reversed.

Figure 2:
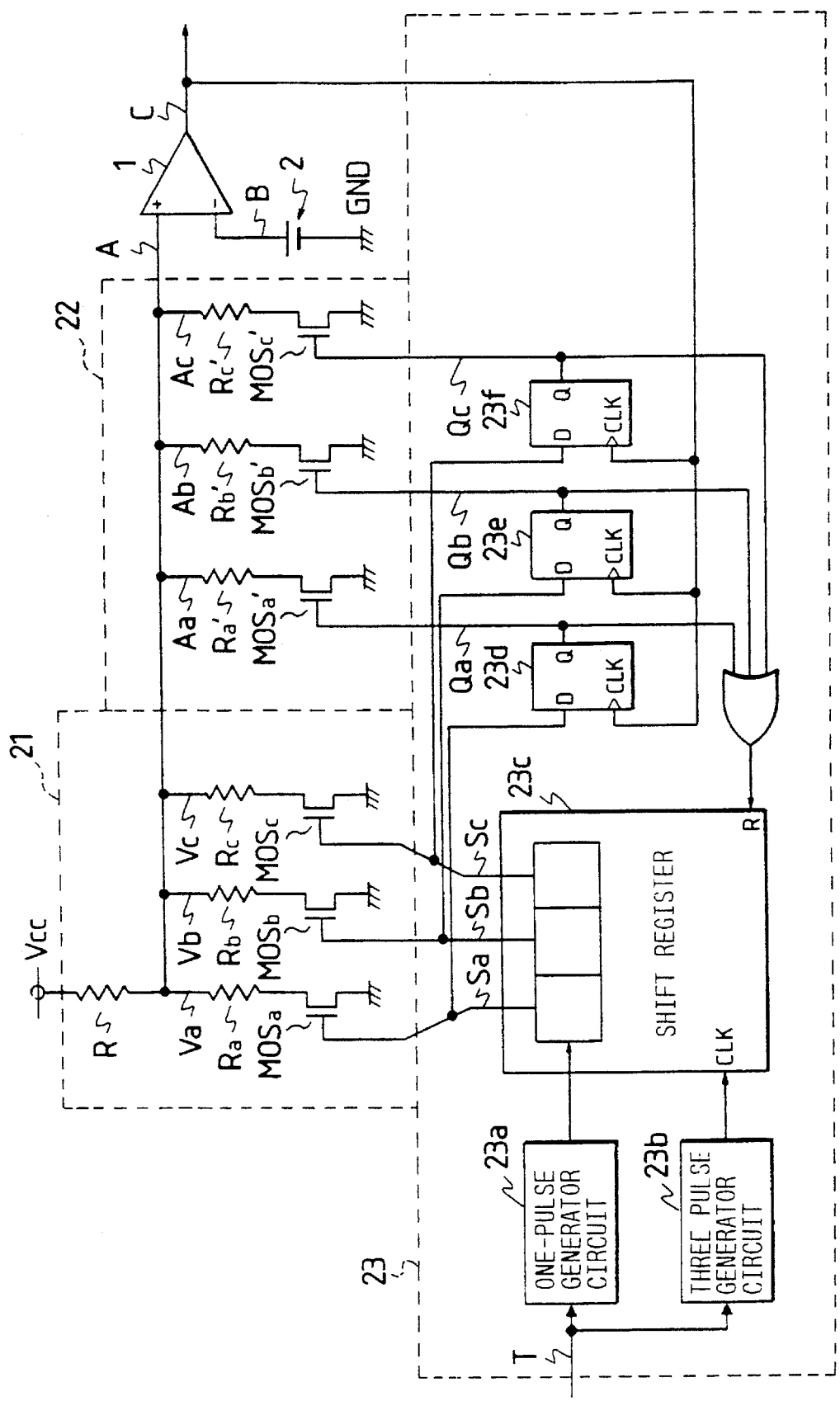
FIG. 2 is a block diagram showing another embodiment of the voltage drop detecting circuit composed in accordance with the present invention.

FIG. 2 shows another embodiment of the present invention. The voltage drop detector circuit of this embodiment is essentially identical to the circuit of the first embodiment shown in FIG. 1 except in the following points: a selection circuit 23 is chiefly composed of a shift register 23c and flip-flops 23d, 23e and 23f; each of the switches in detection voltage generating circuit groups 21 and 22 is composed of a MOS transistor (MOSa, MOSb, MOSc, MOSa', MOSb' or MOSc'); and the timing at which the selection circuit 23 outputs selection signals Qa, Qb and Qc in response to selection signals Sa, Sb and Sc is determined by the voltage drop detection signal C which is supplied as a clock input to each of the flip-flops 23d, 23e and 23f.

As will be understood from the foregoing description, the voltage drop detecting circuit of the present invention is furnished with a plurality of detection voltage generating circuits that rely upon voltage division by resistor change with high enough precision to permit incorporation into ICs and among those detection voltage generating circuits, one circuit is selected that will generate a detection voltage of a sufficient value to offset the deviation of reference voltage from its design value. As a result, the range of variation of the reference voltage can apparently be reduced to less than a half, leading to an improvement in the precision of detection.

What is claimed is:

1. A voltage drop detecting circuit, comprising:

a first resistor connected to a line of the voltage to be monitored;

a first resistor group circuit composed of a plurality of second resistors that are connected downstream of said first resistor and which increase or decrease progressively in resistance;

a second resistor group circuit composed of a plurality of third resistors that are connected downstream of said first resistor and which increase or decrease progressively in resistance in the same order as said second resistors do in said first resistor group circuit;

a selective connecting circuit by which at least one of said resistors in each of the first and second resistor group circuits is connected selectively to a line of reference voltage; and a voltage detection circuit that senses that a voltage at a junction between said first resistor and said second resistor group circuit has dropped below a predetermined level;

wherein a ratio of a resistance of each of said second resistors in said first resistor group circuit to said first resistor and a ratio of a resistance of each of said third resistors in said second resistor group circuit to said first resistor are such that a ratio between said two ratios is in substantial correspondence to a ratio between said voltage being monitored in a steady-state and said predetermined level;

when the voltage being monitored is in a steady-state, said second resistors in said first resistor group circuit are selected sequentially by said selective connecting circuit to be connected to said line of reference voltage; and when a voltage drop is detected by said voltage detection circuit, one of said third resistors in said second resistor group circuit is selectively connected to said line of reference voltage in accordance with the order of one of said second resistors being selected by said selective connecting circuit.

2. A voltage drop detecting circuit which generates a detection voltage of a value that complies with a voltage being monitored, which compares said detection voltage with a reference voltage generated by a reference voltage generating circuit, and which generates a voltage drop detection signal upon sensing that said voltage being monitored has dropped below a predetermined threshold level, said voltage drop detecting circuit, comprising:

a first group of detection voltage generating circuits comprising a first detection voltage generating circuit, including a first switch circuit, and a first resistor circuit including two resistors connected in series with the first switch circuit and having a first resistance ratio which is the same as a ratio between a steady-state value of said voltage being monitored and a design value of said reference voltage or which is within a range of variation of said reference voltage from said design value, and means for applying a first selection signal to actuate the first switch circuit to cause the first detection voltage generating circuit to generate a first divided voltage as said detection voltage by voltage division of said voltage being monitored through resistor change in accordance with said first resistance ratio, and a second detection voltage generating circuit, including a second switch circuit, and a second resistor circuit including two resistors connected in series with the second switch circuit and having a second resistance ratio which is greater or smaller than said first resistance ratio outside said range of variation, and means for applying a second selection signal to actuate the second switch circuit to cause the second detection voltage generating circuit to generate a second divided voltage as said detection voltage by voltage division of said voltage being monitored through resistor change in accordance with said second resistance ratio;

a second group of detection voltage generating circuits comprising a third detection voltage generating circuit, including a third switch circuit, and a third resistor circuit including two resistors connected in series with the third switch circuit and having a third resistance ratio of a value equal to the ratio between said steady-state value of said voltage being monitored and said threshold level as multiplied by said first resistance ratio, and means for applying a third selection signal to actuate the third switch circuit to cause the third detection voltage generating circuit to generate a third divided voltage as said detection voltage by voltage division of said voltage being monitored through resistor change in accordance with said third resistance ratio, and a fourth detection voltage generating circuit, including a fourth switch circuit, and a fourth resistor circuit including two resistors connected in series with the fourth switch circuit and having a fourth resistance ratio of a value equal to the ratio between said steady-state value of said voltage being monitored and said threshold level as multiplied by said second resistance ratio, and means for applying a fourth selection signal to actuate the fourth switch circuit to cause the fourth detection voltage generating circuit to generate a fourth divided voltage as said detection voltage by voltage division of said voltage being monitored through resistor change in accordance with said fourth resistance ratio;

a selection signal generating circuit and means for applying an external trigger signal to the selection signal generating circuit to provide the timing of starting an operation of said circuit for detecting the voltage value of said voltage being monitored, whereby the selection signal generating circuit outputs a first selection signal temporarily and outputs a third selection signal if said voltage drop detection signal is generated in response to said first selection signal and, if no voltage drop detection signal is generated in response to said first selection signal, outputs a second selection signal temporarily and outputs a fourth selection signal upon receiving said voltage drop detection signal in response to said second selection signal.

3. A voltage drop detecting circuit according to claim 2, wherein said first, second, third and fourth resistor circuits share one resistor for specifying said associated resistance ratios.

* * * * *